(12) United States Patent
Iwasaki et al.

(10) Patent No.: US 11,101,373 B2
(45) Date of Patent: Aug. 24, 2021

(54) INSULATED GATE BIPOLAR TRANSISTOR AND MANUFACTURING METHOD THEREOF

(71) Applicant: DENSO CORPORATION, Kariya (JP)

(72) Inventors: Shinya Iwasaki, Toyota (JP); Hiroshi Hosokawa, Toyota (JP); Yuma Kagata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/677,920

(22) Filed: Nov. 8, 2019

(65) Prior Publication Data

US 2020/0152777 A1 May 14, 2020

(30) Foreign Application Priority Data

Nov. 12, 2018 (JP) .............................. JP2018-212033

(51) Int. Cl.
*H01L 29/737* (2006.01)
*H01L 29/10* (2006.01)
*H01L 29/66* (2006.01)
*H01L 29/49* (2006.01)

(52) U.S. Cl.
CPC ...... *H01L 29/7371* (2013.01); *H01L 29/1004* (2013.01); *H01L 29/4983* (2013.01); *H01L 29/66348* (2013.01)

(58) Field of Classification Search
CPC ........... H01L 29/7397; H01L 29/66348; H01L 29/7371; H01L 29/1004; H01L 29/4983; H01L 29/1095
See application file for complete search history.

(56) References Cited

U.S. PATENT DOCUMENTS

| 6,509,607 | B1 * | 1/2003 | Jerred | ................ H01L 29/7813 |
| | | | | 257/330 |
| 2016/0351561 | A1 * | 12/2016 | Senoo | ................. H01L 29/0619 |
| 2016/0351688 | A1 * | 12/2016 | Kameyama | ......... H01L 29/7813 |
| 2017/0005186 | A1 | 1/2017 | Hirabayashi et al. | |
| 2017/0162681 | A1 | 6/2017 | Okawara et al. | |

* cited by examiner

*Primary Examiner* — Jose R Diaz
(74) *Attorney, Agent, or Firm* — Posz Law Group, PLC

(57) ABSTRACT

An insulated gate bipolar transistor includes: a semiconductor substrate; an emitter electrode arranged on one main surface of the semiconductor substrate; and a trench gate arranged in a rectangular trench having a rectangular shape and disposed on the one main surface of the semiconductor substrate. The semiconductor substrate includes a body contact region and an emitter region in a rectangular region surrounded by the rectangular trench. The rectangular trench has a straight trench that constitutes one side of the rectangular trench. The body contact region is in contact with a side of the straight trench. The emitter region is in contact with the side of the straight trench, and is adjacent to the body contact region. The body contact region has a protrusion portion protruding in a depth direction from a center portion of the body contact region.

7 Claims, 15 Drawing Sheets

INSULATED GATE BIPOLAR TRANSISTOR AND MANUFACTURING METHOD THEREOF

CROSS REFERENCE TO RELATED APPLICATION

The present application claims the benefit of priority from Japanese Patent Application No. 2018-212033 filed on Nov. 12, 2018. The entire disclosure of the above application is incorporated herein by reference.

TECHNICAL FIELD

The present disclosure relates to an insulated gate bipolar transistor and a manufacturing method thereof.

BACKGROUND

An insulated gate bipolar transistor (hereinafter also referred to as an IGBT) is well known. In the IGBT, a rectangular trench is formed on the upper surface of a semiconductor substrate, and a trench gate is arranged in the rectangular trench. A p-type body contact region and an n-type emitter region are arranged in a rectangular region surrounded by the rectangular trench. The body contact region and the emitter region are disposed adjacent to and in contact with the sidewall of the straight trench constituting one side of the rectangular trench.

SUMMARY

According to an example, an insulated gate bipolar transistor includes: a semiconductor substrate; an emitter electrode arranged on one main surface of the semiconductor substrate; and a trench gate arranged in a rectangular trench having a rectangular shape and disposed on the one main surface of the semiconductor substrate. The semiconductor substrate includes a body contact region and an emitter region in a rectangular region surrounded by the rectangular trench. The rectangular trench has a straight trench that constitutes one side of the rectangular trench. The body contact region is in contact with a side of the straight trench. The emitter region is in contact with the side of the straight trench, and is adjacent to the body contact region. The body contact region has a protrusion portion protruding in a depth direction from a center portion of the body contact region.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
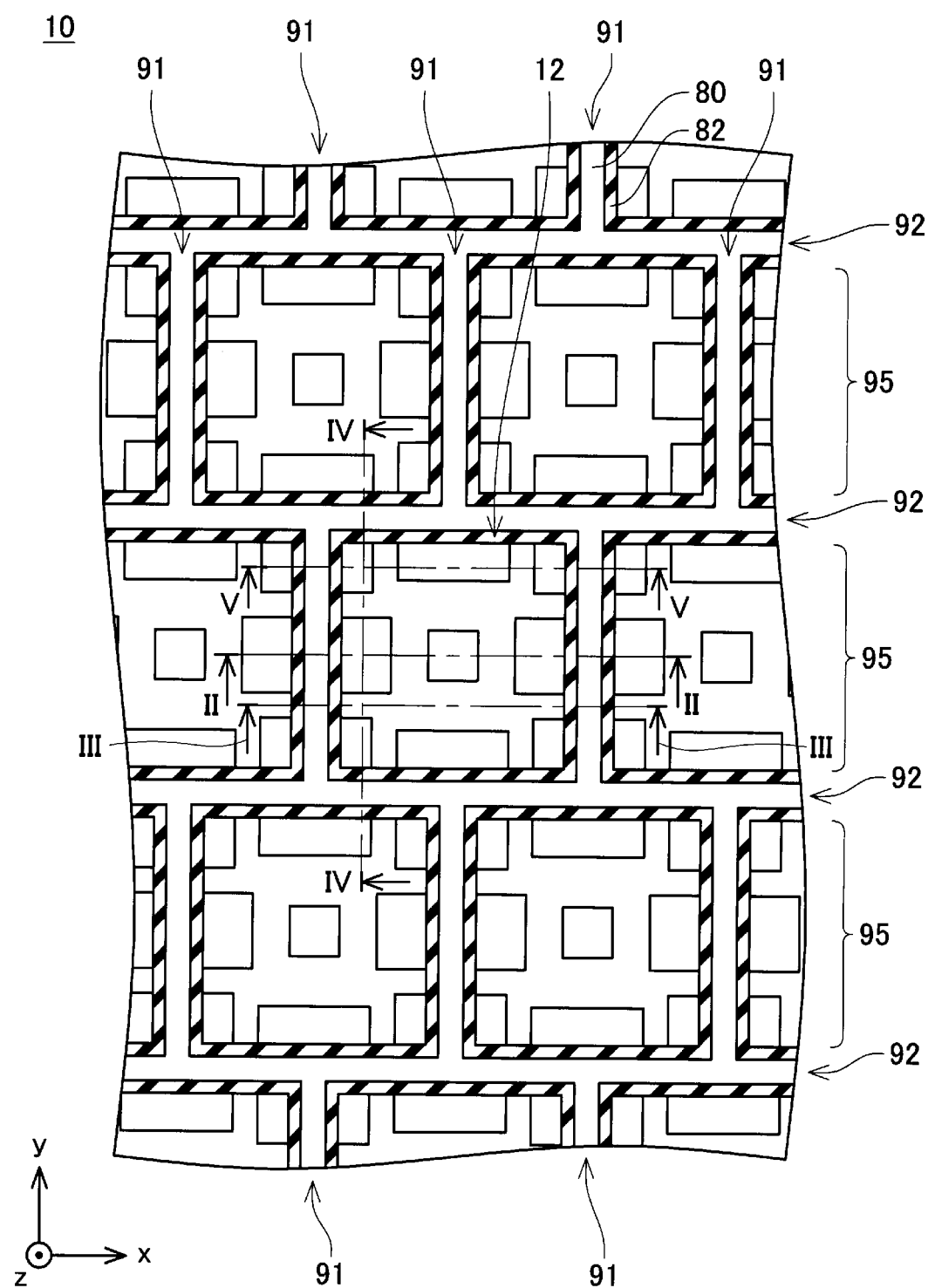
FIG. 1 is a plan view showing an upper surface of a semiconductor substrate.

In a conceivable IGBT, hole carriers injected from the back side of the semiconductor substrate are discharged through the body contact region. Some of the injected hole carriers move along the sidewall of the rectangular trench from the back side to the front side of the semiconductor substrate below the emitter region. When such hole carriers flow into the emitter region, latch-up in which a parasitic transistor operates may occur. In order to suppress the latch-up, it is preferable to efficiently discharge the hole carriers to the body contact region. The present embodiments provide a technique for suppressing the latch-up in an IGBT having a rectangular trench.

The manufacturing method of an insulated gate bipolar transistor according to the present embodiments includes: a step of forming a rectangular trench arranged to have a rectangular shape on one main surface of a semiconductor substrate; a step of forming a gate insulation film on the inner surface of the rectangular trench; a step of filling the rectangular trench with a gate electrode after forming the gate insulation film in such a manner that the upper surface of the gate electrode is deeper than the one main surface of the semiconductor substrate; and a step of forming a body contact region having a first conductivity type in a part of a rectangular region surrounded by the rectangular trench using an ion implantation technique in such a manner that the body contact region is in contact with the side surface of the straight trench constituting one side of the rectangular trench and is disposed to be adjacent to the formation region of the emitter region having the second conductivity type arranged in contact with the side surface of the straight trench. In the step of forming the body contact region, a first conductivity type impurity is implanted across the inner side and the outer side of the straight trench. Here, the formation area where the emitter region is formed is an area where the emitter region is formed in the product of the insulated gate bipolar transistor. The emitter region may be formed in the formation region before the body contact region is formed by ion implantation. Alternatively, the emitter region may be formed in the formation area after the body contact region is formed by the ion implantation. The depth of the body contact region may increase as it approaches toward the side surface of the straight trench. The material of the gate electrode may be polysilicon. In this manufacturing method, when the body contact region is formed by ion implantation, the first conductivity type impurity is implanted across the inner side and the outer side of the straight trench. At this time, the upper surface of the gate electrode filled in the straight trench is deeper than the one main surface of the semiconductor substrate. For this reason, the depth of the first conductivity type impurity implanted into the inside of the gate electrode from the upper surface of the gate electrode in the linear trench is deeper than the depth of the first conductivity type impurity implanted into the semiconductor substrate from the one main surface of the semiconductor substrate. A part of the first conductivity type impurity implanted into the gate electrode is diffused and introduced along the surface direction. Therefore, the first conductivity type impurity is also introduced into the position in contact with the side surface of the straight trench along the surface direction. As a result, the body contact region is deeply formed at a position in contact with the side surface of the straight trench. A part of the body contact region formed in such a depth is disposed at a position adjacent to the emitter region, so that the carriers that have moved along the side surface of the rectangular trench below the emitter region can be efficiently discharged. For this reason, in the insulated gate bipolar transistor manufactured by the above manufacturing method, the latch-up is suppressed.

An insulated gate bipolar transistor according to the present disclosure includes: a semiconductor substrate; an emitter electrode arranged on one main surface of the semiconductor substrate; and a trench gate arranged in the rectangular trench which is disposed to have a rectangular shape on the one main surface of the semiconductor substrate. The semiconductor substrate may include: a body contact region having the first conductivity type arranged in a part of a rectangular region surrounded by the rectangular trench, and is in contact with the emitter electrode; and an emitter region having the second conductivity type disposed in a part of the rectangular region and is in contact with the emitter electrode. The rectangular trench may include a straight trench that constitutes one side of the rectangular trench. The body contact region is in contact with a side surface of the straight trench. The emitter region is in contact with the side surface of the straight trench and is adjacent to the body contact region. The body contact region may have a protrusion portion that protrudes in a depth direction from a central portion of the rectangular region at a position adjacent to the emitter region and in contact with the side surface of the linear trench. The depth of the protrusion portion may increase as approaching the side surface of the straight trench. In this insulated gate bipolar transistor, since the protrusion portion of the body contact region is disposed at a position adjacent to the emitter region, carriers that have moved along the side surface of the rectangular trench below the emitter region are discharged efficiently. For this reason, the latch-up is suppressed in the insulated gate bipolar transistor.

FIGS. 1 to 5 show an IGBT 10 according to the present embodiment. As shown in FIGS. 2 to 5, the IGBT 10 includes a silicon single crystal semiconductor substrate 20, an emitter electrode 50, and a collector electrode 60. The emitter electrode 50 is arranged so as to cover the upper surface 20a of the semiconductor substrate 20. The collector electrode 60 is arranged so as to cover the lower surface 20b of the semiconductor substrate 20. In FIG. 1, the structure above the upper surface 20a of the semiconductor substrate 20 such as the emitter electrode 50 is not shown. In the following description, one direction parallel to the upper surface 20a is referred to as an x direction, and a direction parallel to the upper surface 20a and perpendicular to the x direction is referred to as a y direction, and the depth direction of the semiconductor substrate 20 (that is a direction perpendicular to the x direction and the y direction) is referred to as the z direction.

As shown in FIG. 1, a plurality of trenches 91 and a plurality of other trenches 92 are formed on the upper surface 20a of the semiconductor substrate 20. As shown in FIGS. 2 to 5, each of the trenches 91 and 92 extends substantially perpendicular to the upper surface 20a of the semiconductor substrate 20 (that is, along the z direction). As shown in FIG. 1, each trench 92 extends linearly in the x direction when viewing the top surface 20a of the semiconductor substrate 20 from above as a plan view. A plurality of trenches 92 are arranged at intervals in the y direction. Each trench 91 extends linearly in the y direction when viewing the upper surface 20a of the semiconductor substrate 20 from above as a plan view. A plurality of trenches 91 are arranged in each range 95 sandwiched between two adjacent trenches 92. Both ends of each trench 91 are connected to the trenches 92 on both sides thereof, respectively. Each trench 91 is arranged so that its position is shifted in the x direction with respect to another adjacent trench 91 in the y direction. The trench 91 intersects each trench 92 in a three-way manner with a T shape at each end thereof. The upper surface 20a of the semiconductor substrate 20 is partitioned into rectangular regions by the trenches 91 and 92. Hereinafter, the rectangular semiconductor region partitioned by the trenches 91 and 92 is referred to as a rectangular region 12. Hereinafter, a set of trenches 91 and 92 surrounding one rectangular region 12 is referred to as a rectangular trench.

As shown in FIGS. 1 to 5, the inner surface (that is, the bottom surface and the side surface) of the rectangular trench is covered with a gate insulation film 82. A gate electrode 80 is provided in the rectangular trench. The gate electrode 80 faces the semiconductor substrate 20 with the gate insulation film 82 sandwiched therebetween. The gate electrode 80 is insulated from the semiconductor substrate 20 by the gate insulation film 82. A structure in which the gate insulation film 82 and the gate electrode 80 are combined is called a trench gate. The gate electrode 80 is provided across the inside of the trench 91 and the inside of the trench 92. Therefore, the gate electrode 80 extends to have a rectangular shape along the rectangular trench. For this reason, as shown in FIG. 1, the periphery of each rectangular region 12 is surrounded by the gate electrode 80 when viewing from above. As shown in FIGS. 2-5, the upper surface of the gate electrode 80 is covered with an interlayer insulation film 78. The upper surface 20a of the semiconductor substrate 20 in the vicinity of the trenches 91 and 92 is also covered with the interlayer insulation film 78. An emitter electrode 50 is provided so as to cover the interlayer insulation film 78. The gate electrode 80 is insulated from the emitter electrode 50 by the interlayer insulation film 78. The emitter electrode 50 is in contact with the upper surface 20a of the semiconductor substrate 20 in the opening 79 where the interlayer insulation film 78 is not provided.

Figure 6:
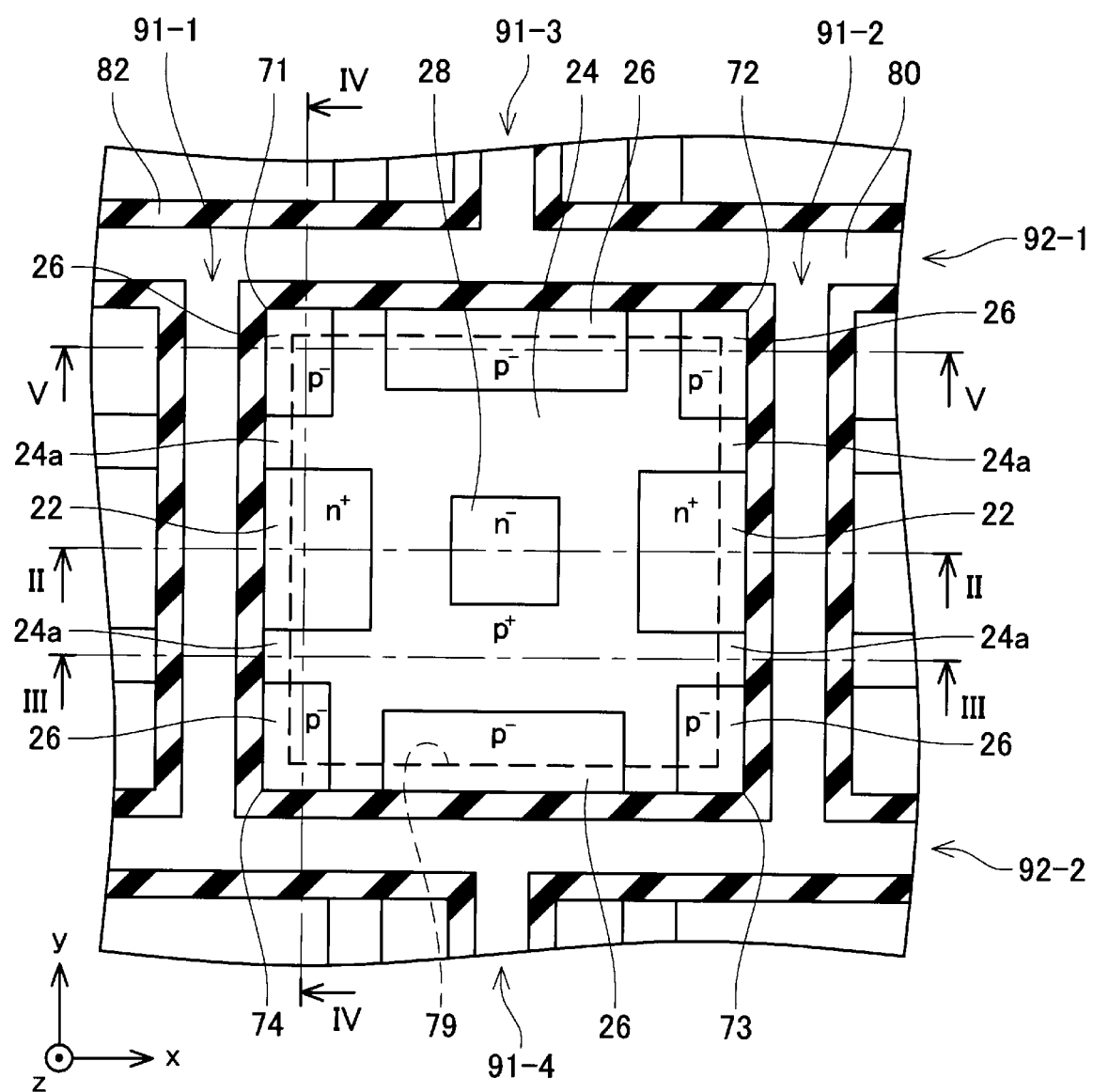
FIG. 6 is an enlarged plan view of a rectangular area.

Next, the structure of each rectangular region 12 will be described. In addition, since the structure of each rectangular region 12 is mutually equal, the structure of the one rectangular region 12 will be described below. FIG. 6 shows an enlarged plan view of one rectangular region 12. As shown in FIG. 6, the rectangular trench includes two trenches 91 (i.e., trenches 91-1 and 91-2) and two trenches 92 (i.e., trenches 92-1 and 92-2). In other words, the rectangular region 12 is surrounded by the trenches 91-1, 91-2, 92-1 and 92-2. Hereinafter, in the rectangular region 12, a portion adjacent to the connection portion between the trench 91-1 and the trench 92-1 is referred to as a corner portion 71, and a portion adjacent to the connection portion between the trench 92-1 and the trench 91-2. Is called a corner portion 72, a portion adjacent to the connecting portion between the trench 91-2 and the trench 92-2 is called a corner portion 73, and a portion adjacent to the connecting portion between the trench 92-2 and the trench 91-1 is the corner portion 74. The trench 92-1 is connected to a trench 91-3 that constitutes an adjacent rectangular trench. The trench 92-2 is connected to a trench 91-4 that constitutes an adjacent rectangular trench. FIG. 6 shows the position of the opening 79 by a broken line. As shown in FIG. 6, the opening 79 is disposed in the rectangular region 12. In the opening 79, the emitter electrode 50 is in contact with the upper surface 20a of the semiconductor substrate 20.

As shown in FIGS. 2 to 6, an emitter region 22, a body contact region 24, a surface layer body region 26, an separation body region 27, a pillar region 28, a barrier region 30, and a lower body region 32 are arranged inside the rectangular region 12.

Figure 2:
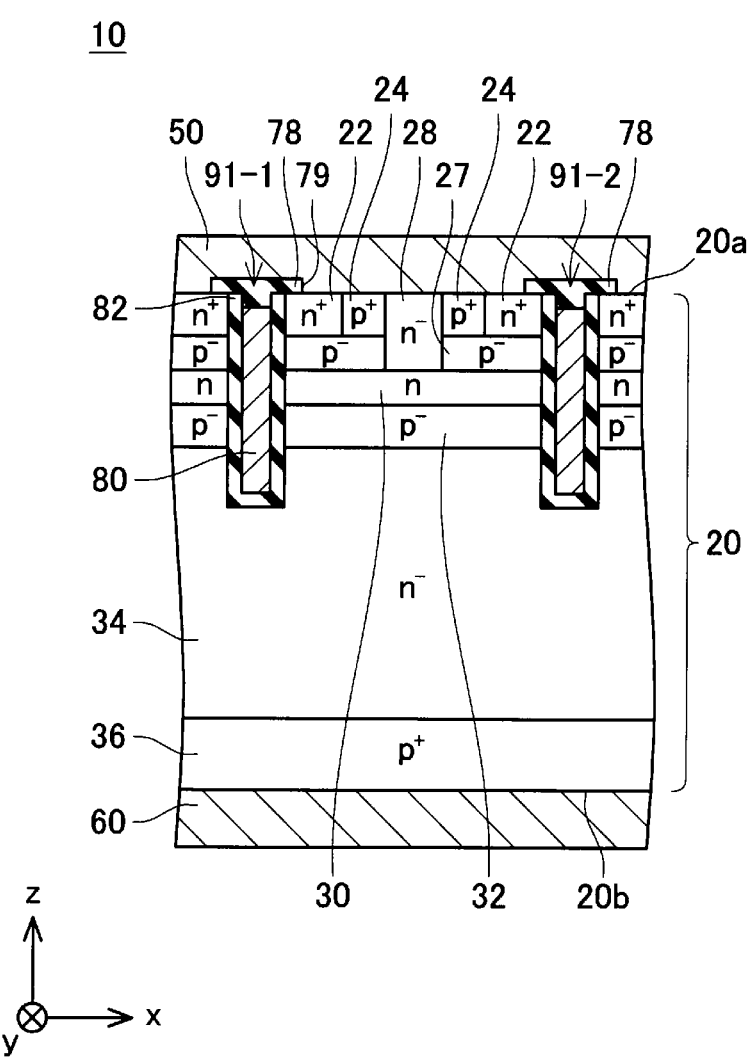
FIG. 2 is a longitudinal cross-sectional view of the semiconductor substrate taken along line II-II in FIG. 1.

The pillar region 28 is made of an n-type semiconductor having a low n-type impurity concentration. As shown in FIG. 2, the pillar region 28 is arranged in a range exposed on the upper surface 20a of the semiconductor substrate 20. As shown in FIGS. 2 and 6, the pillar region 28 is disposed at the center of the rectangular region 12 and is in Schottky contact with the emitter electrode 50 in the opening 79.

Figure 3:
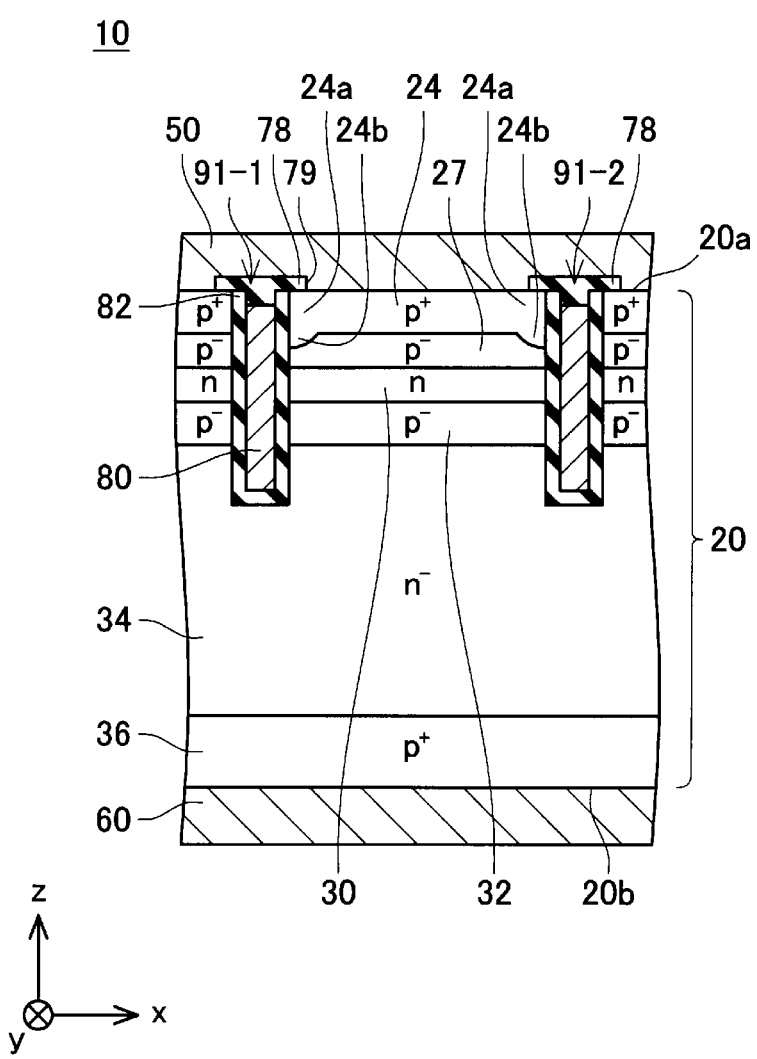
FIG. 3 is a longitudinal cross-sectional view of the semiconductor substrate taken along line III-III in FIG. 1.
Figure 4:
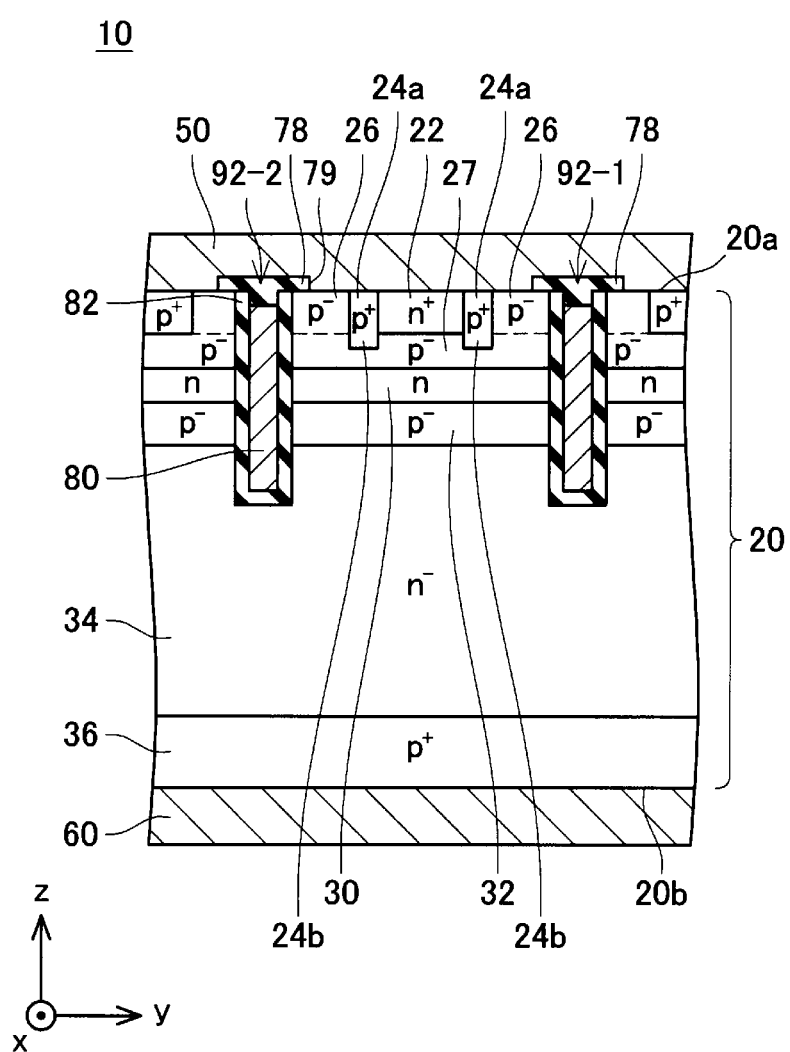
FIG. 4 is a longitudinal cross-sectional view of the semiconductor substrate taken along line IV-IV in FIG. 1.

The body contact region 24 is made of a p-type semiconductor having a high p-type impurity concentration. As shown in FIGS. 2 to 5, the body contact region 24 is disposed in a range exposed on the upper surface 20a of the semiconductor substrate 20. As shown in FIG. 6, the body contact region 24 surrounds the periphery of the pillar region 28 on the upper surface 20a. As shown in FIGS. 2 to 6, the body contact region 24 is in ohmic contact with the emitter electrode 50 in the opening 79. The body contact region 24 is further in contact with the side surface of the gate insulation film 82 in the trenches 91-1, 91-2, 92-1 and 92-2. Hereinafter, contact with the side surface of the gate insulation film in the trench may be referred to as "contact with the side surface of the trench". As shown in FIG. 6, the body contact region 24 has a portion extending from the portion surrounding the periphery of the pillar region 28 toward the trenches 91-1, 91-2, 92-1 and 92-2. In this specification, in particular, a portion of the body contact region 24 adjacent to the emitter region 22, more specifically, a part of the body contact region 24 adjacent to the emitter region 22 in the Y direction is referred to as an adjacent portion 24a. As shown in FIGS. 3 and 4, the body contact region 24 further includes a protrusion portion 24b protruding in the depth direction from the central portion in the rectangular region 12 (that is, the portion surrounding the periphery of the pillar region 28) in the range corresponding to the adjacent portion 24 a. The depth of the protrusion portion 24b increases as approaching the side surfaces of the trenches 91-1 and 91-2.

The emitter region 22 is made of an n-type semiconductor having a high n-type impurity concentration. As shown in FIG. 6, two emitter regions 22 are provided in one rectangular region 12. As shown in FIGS. 2 and 4, each emitter region 22 is arranged in a range exposed on the upper surface 20a of the semiconductor substrate 20. As shown in FIGS. 2, 4, and 6, each emitter region 22 is in ohmic contact with the emitter electrode 50 in the opening 79. As shown in FIG. 6, one emitter region 22 is in contact with the side surface of the trench 91-1 at the center of the trench 91-1. The other emitter region 22 is in contact with the side surface of the trench 91-2 at the center portion of the trench 91-2. As an example, the planar shape of the emitter region 22 (the shape shown in FIG. 6) has a width in the x direction (i.e., the width in the direction perpendicular to the side surface of the trench) longer than a half of the width in the y direction (i.e., the width in the longitudinal direction of the trench). Therefore, as will be described later, most of the hole carriers that have moved to the separation body region 27 below the emitter region 22 are discharged from the adjacent portion 24a of the body contact region 24.

Figure 5:
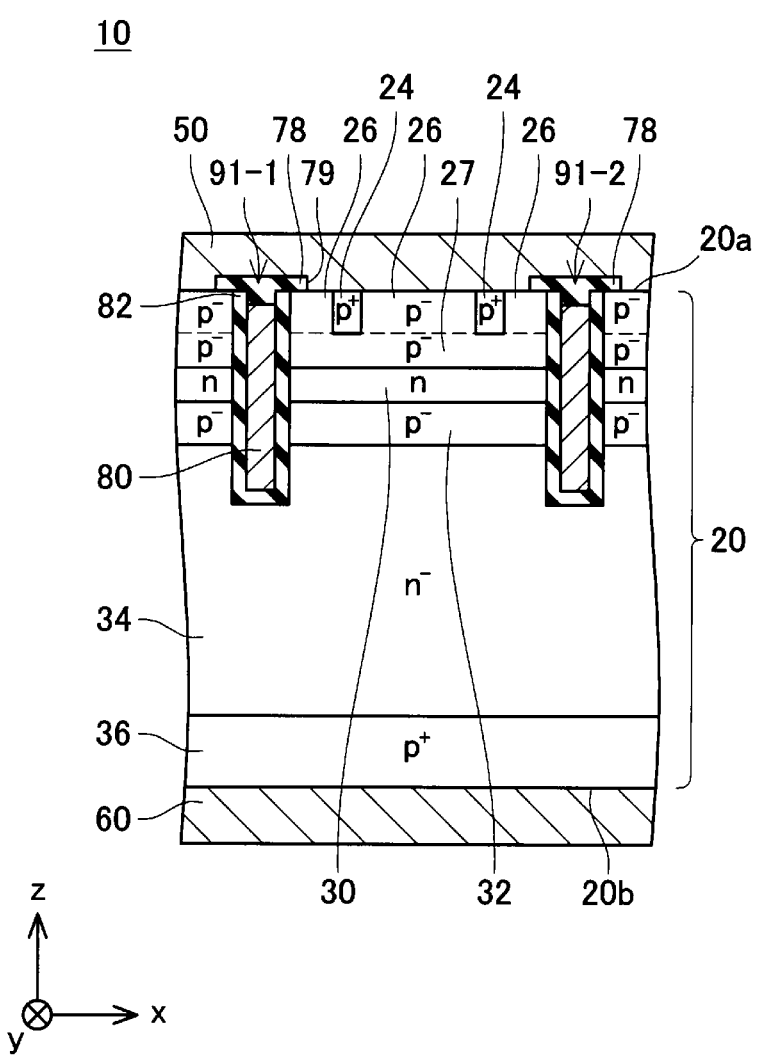
FIG. 5 is a longitudinal cross-sectional view of the semiconductor substrate taken along line V-V in FIG. 1.

The surface layer body region 26 is made of a semiconductor having a lower p-type impurity concentration than the body contact region 24. As shown in FIGS. 4 and 5, the surface layer body region 26 is disposed in a range exposed on the upper surface 20a of the semiconductor substrate 20. As shown in FIG. 6, the surface layer body region 26 is separated into six regions by the body contact region 24. One of the surface layer body regions 26 is in contact with the side surfaces of the trenches 91-1 and 92-1 at the corner portion 71. The other one of the surface layer body regions 26 is in contact with the side surfaces of the trenches 91-2 and 92-1 at the corner portion 72. The other one of the surface layer body regions 26 is in contact with the side surfaces of the trenches 91-2 and 92-2 at the corner portion 73. The other one of the surface layer body regions 26 is in contact with the side surfaces of the trenches 91-1 and 92-2 at the corner 74. The other one of the surface layer body regions 26 is in contact with the side surface of the trench 92-1 between the corner portion 71 and the corner portion 72 at the center portion of the trench 92-1. The other one of the surface body regions 26 is in contact with the side surface of the trench 92-2 between the corner portion 73 and the corner portion 74 at the center portion of the trench 92-2. The surface layer body region 26 is in contact with the emitter electrode 50 in the opening 79.

The separation body region 27 is made of a p-type semiconductor having a p-type impurity concentration lower than that of body contact region 24. The p-type impurity concentrations of the surface layer body region 26 and the separation body region 27 are substantially equal to each other. As shown in FIGS. 2 to 5, the separation body region 27 is provided below the emitter region 22, the body contact region 24, and the surface layer body region 26. The separation body region 27 is in contact with the emitter region 22, the body contact region 24, and the surface layer body region 26 at a bottom thereof. The separation body region 27 extends across the entire surface direction (i.e., the x direction and the y direction) of the rectangular region 12 except for the lower portion of the pillar region 28. The pillar region 28 extends downward from the upper surface 20a and penetrates the separation body region 27. The separation body region 27 is in contact with the side surfaces of the trenches 91-1, 91-2, 92-1 and 92-2 below the emitter region 22, the body contact region 24, and the surface layer body region 26.

The barrier region 30 is made of an n-type semiconductor having a lower n-type impurity than the emitter region 22. As shown in FIGS. 2 to 5, the barrier region 30 is disposed below the separation body region 27 and the pillar region 28. The barrier region 30 is in contact with the separation body region 27 and the pillar region 28 at the bottom thereof. The barrier region 30 extends over the entire area of the rectangular region 12 in the surface direction. The barrier region 30 is in contact with the side surfaces of the trenches 91-1, 91-2, 92-1 and 92-2 below the separation body region 27. The barrier region 30 is separated from the emitter region 22 by the separation body region 27.

The lower body region 32 is made of a p-type semiconductor having a p-type impurity concentration lower than that of body contact region 24. As shown in FIGS. 2 to 5, the lower body region 32 is disposed below the barrier region 30. The lower body region 32 is in contact with barrier region 30 at the bottom thereof. The lower body region 32 extends over the entire area in the surface direction of the rectangular region 12. The lower body region 32 is in contact with the side surfaces of the trenches 91-1, 91-2, 92-1 and 92-2 below the barrier region 30. The lower body region 32 is separated from separation body region 27 by the barrier region 30.

The semiconductor substrate 20 has a drift region 34 and a collector region 36. The drift region 34 and the collector region 36 are disposed below the plurality of rectangular regions 12.

The drift region 34 is made of an n-type semiconductor having an n-type impurity concentration lower than that of the barrier region 30 and the pillar region 28. As shown in FIGS. 2 to 5, the drift region 34 is arranged below the lower body region 32. The drift region 34 is in contact with the lower body region 32 at the bottom thereof. The drift region 34 extends in the surface direction across the lower ranges of the plurality of rectangular regions 12. The drift region 34 extends over the entire surface of the semiconductor substrate 20 in the surface direction. The drift region 34 is in contact with the lower ends of the trenches 91 and 92. The drift region 34 is separated from the barrier region 30 by the lower body region 32.

The collector region 36 is made of a p-type semiconductor having a higher p-type impurity concentration than the separation body region 27 and the lower body region 32. As shown in FIGS. 2 to 5, the collector region 36 is disposed below the drift region 34. The collector region 36 is in contact with the drift region 34 at the bottom thereof. The collector region 36 is separated from the lower body region 32 by the drift region 34. The collector region 36 is disposed in a range exposed on the lower surface 20b of the semiconductor substrate 20. The collector region 36 is in ohmic contact with the collector electrode 60.

Next, the operation of the IGBT 10 will be described. When the IGBT 10 is operated, a voltage for controlling the collector electrode 60 to be positive is applied between the collector electrode 60 and the emitter electrode 50. When a voltage equal to or higher than the gate threshold is applied to the gate electrode 80, the surface body region 26, the separation body region 27, and the lower body region 32 in the range in contact with the gate insulation film 82 are inverted to n-type, and a channel is formed. For example, in the cross section shown in FIG. 2, the channel is formed in the separation body region 27 and the lower body region 32 in a range in contact with the gate insulation film 82 of the trench 91. When the channel is formed, electron carriers flow from the emitter electrode 50 into the drift region 34 through the emitter region 22 and the channel. At the same time, hole carriers flow from the collector electrode 60 through the collector region 36 into the drift region 34. As a result, the electric resistance of the drift region 34 decreases due to the conductivity modulation phenomenon. The electron carriers flowing into the drift region 34 pass through the drift region 34 and the collector region 36 and flow into the collector electrode 60. In this way, current flows through the IGBT 10 as electrons flow from the emitter electrode 50 to the collector electrode 60.

Further, the hole carriers flowed into the drift region 34 pass through the lower body region 32 and the barrier region 30 and flow into the separation body region 27, and then flow from the body contact region 24 to the emitter electrode 50. At this time, the barrier region 30 provides a barrier that blocks the flow of hole carriers. Therefore, the hole carriers are suppressed from flowing into the separation body region 27. As a result, the concentration of hole carriers in the drift region 34 increases, so that the electric resistance of the drift region 34 is further reduced. For this reason, the on-state voltage of the IGBT 10 is reduced.

Figure 7:
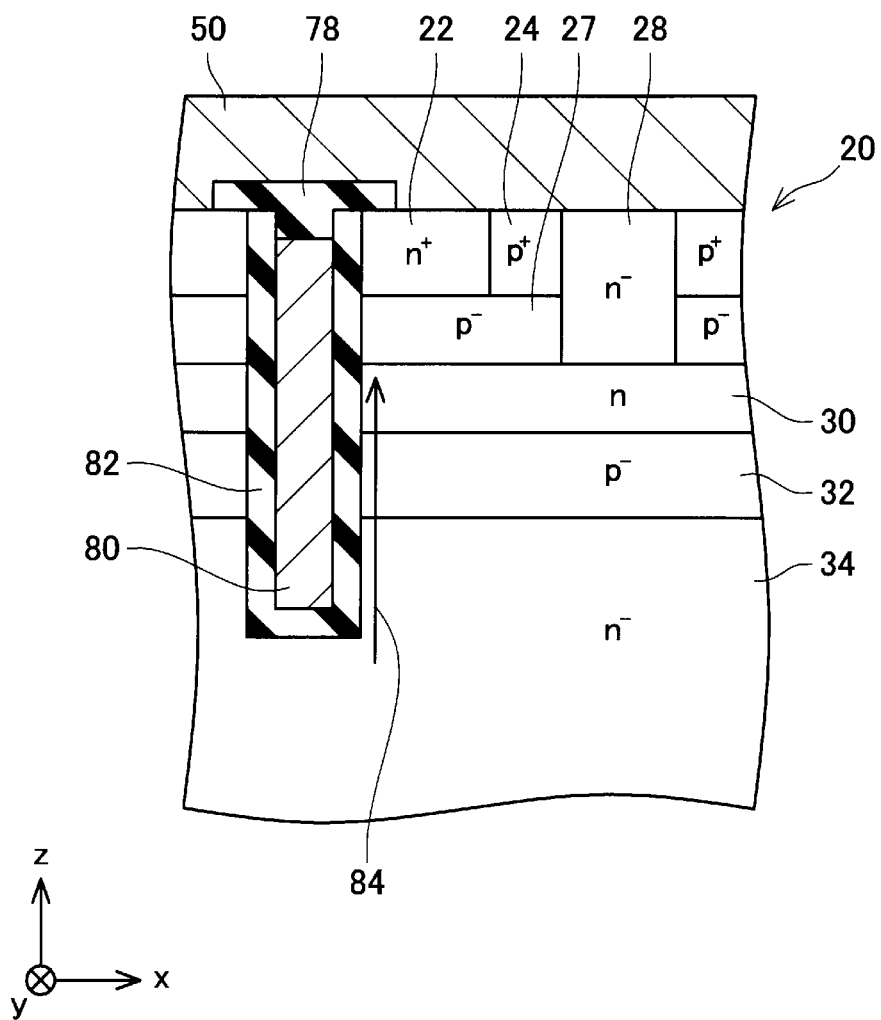
FIG. 7 is an enlarged cross-sectional view of the emitter region of FIG. 2 and its surrounding area.
Figure 8:
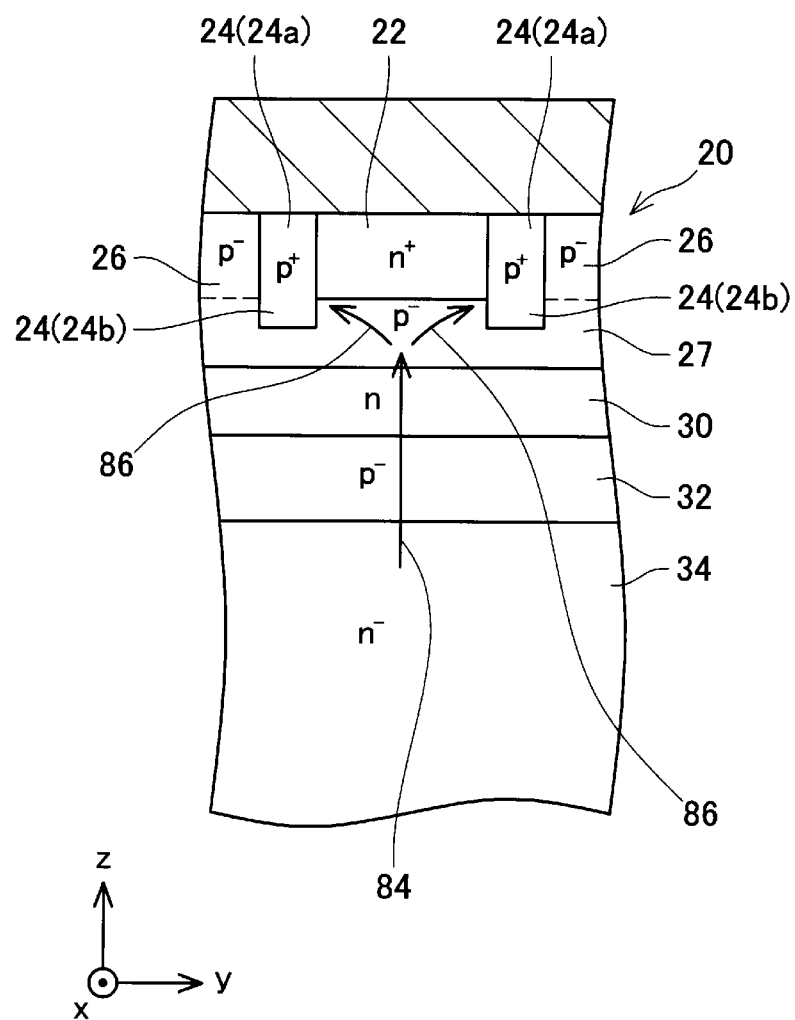
FIG. 8 is an enlarged cross-sectional view of the emitter region of FIG. 4 and its surrounding area.

FIG. 7 shows an enlarged view of the vicinity of the emitter region 22 of FIG. 2. FIG. 8 shows an enlarged view of the vicinity of the emitter region 22 of FIG. 4. As shown in FIGS. 7 and 8, hole carriers flow into the separation body region 27 below the emitter region 22 as indicated by an arrow 84. As shown in FIG. 8, a protrusion portion 24b is formed in an adjacent portion 24a adjacent to the emitter region 22 in the body contact region 24. For this reason, the distance between the separation body region 27 below the emitter region 22 and the protrusion portion 24b is shortened, and the electric resistance with respect to hole carriers therebetween is low. Therefore, most of the hole carriers flowing into the separation body region 27 below the emitter region 22 can efficiently flow into the protrusion portion 24b, that is, the body contact region 24 as indicated by the arrow 86. As described above, in the IGBT 10 of the present embodiment, many hole carriers can flow into the protrusion portion 24b of the body contact region 24 through a path having a low electric resistance, and therefore, the separation body region 27 below the emitter region 22 has a potential which hardly increases. For this reason, in the IGBT 10, it is difficult for hole carriers to flow from the separation body region 27 into the emitter region 22, and the latch-up is suppressed.

In the above-described embodiment, the protrusion portion 24b of the body contact region 24 is formed deeper than the emitter region 22. Alternatively, when the depth of the body contact region 24 other than the protrusion portion 24b is formed shallower than the emitter region 22, the protrusion portion 24b may also be formed shallower than the emitter region 22.

In the above-described embodiment, the IGBT 10 has the barrier region 30 and the pillar region 28. Alternatively, the IGBT 10 may not have the barrier region 30 and the pillar region 28. In this case, the separation body region 27 is in direct contact with the drift region 34. Even in such a configuration, the IGBT can operate. Moreover, a configuration having the barrier region 30 without including the pillar region 28 may be applied to the IGBT 10.

Next, with reference to FIGS. 9 to 15 which are enlarged cross-sectional views corresponding to FIG. 3, the step of forming the body contact region 24 in the manufacturing method of the IGBT 10 will be described. For other steps, a conventional manufacturing method may be used.

Figure 9:
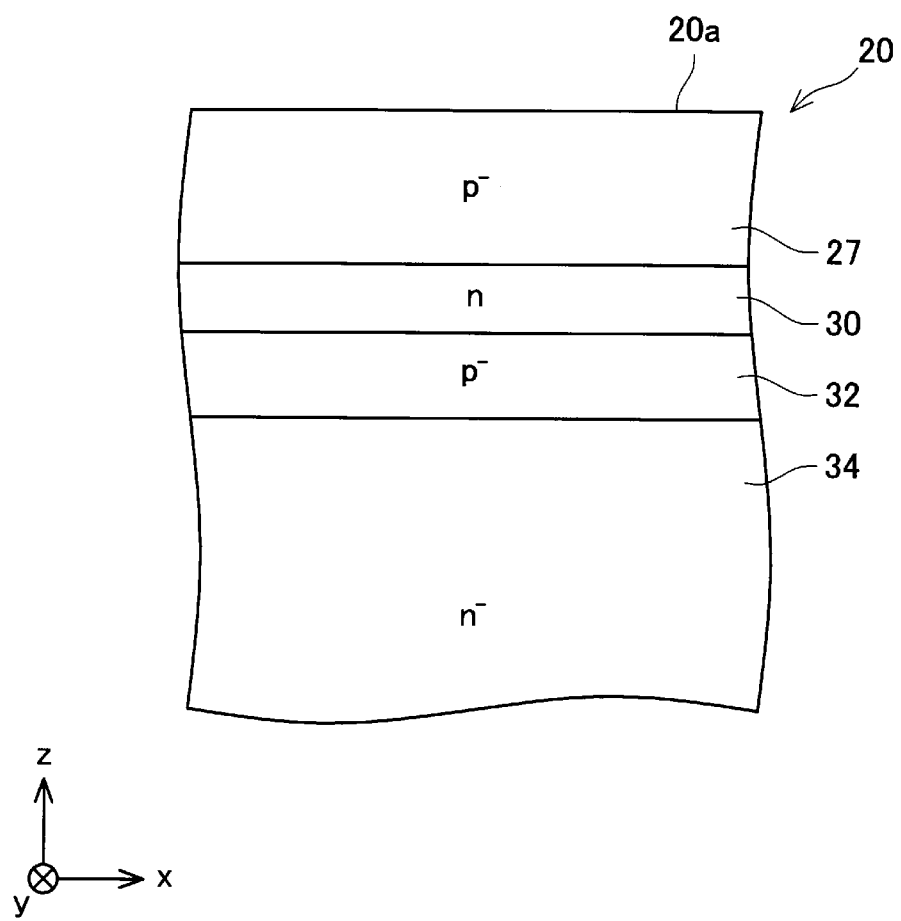
FIG. 9 is an enlarged cross-sectional view corresponding to FIG. 3, showing a step of forming a body contact region in the IGBT manufacturing method.

First, as shown in FIG. 9, a semiconductor substrate 10 in which a drift region 34, a lower body region 32, a barrier region 30, and a separation body region 27 are stacked is prepared. The lower body region 32, the barrier region 30, and the separation body region 27 are formed by implanting impurities into the drift region 34 from the upper surface 20a of the semiconductor substrate 20 using an ion implantation technique.

Figure 10:
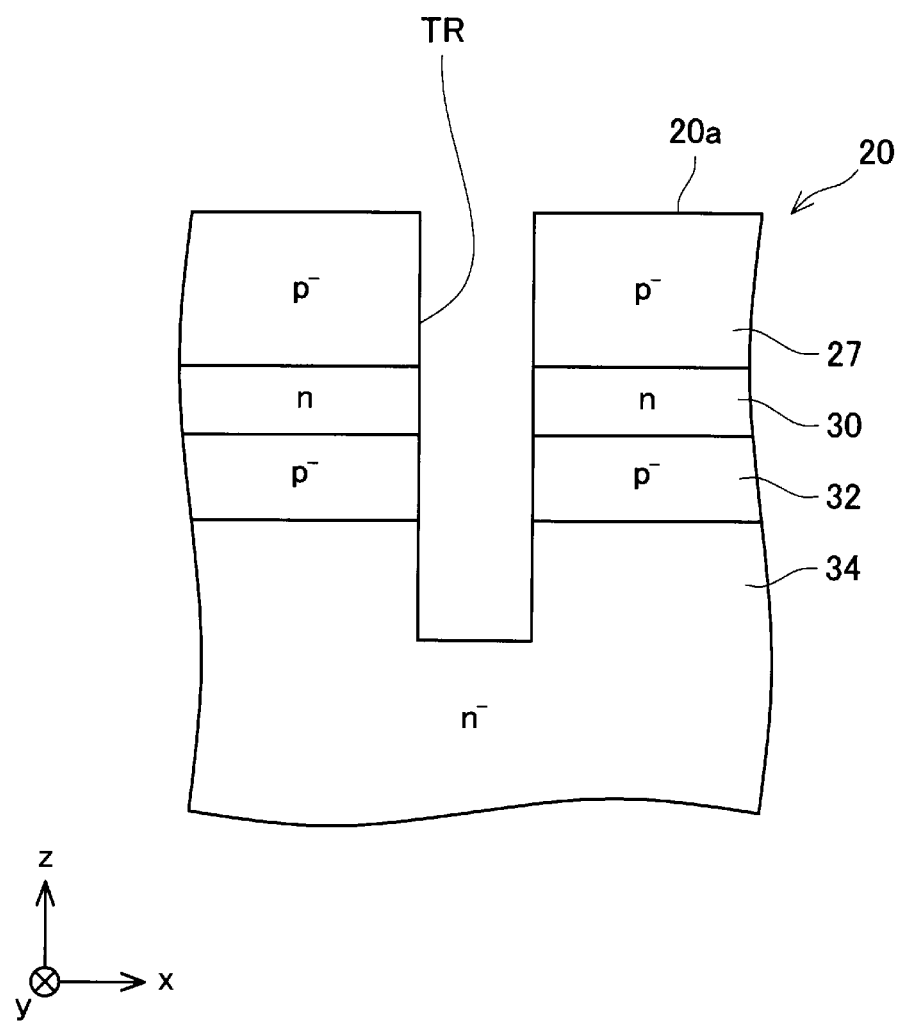
FIG. 10 is an enlarged cross-sectional view corresponding to FIG. 3, showing the step of forming the body contact region in the IGBT manufacturing method.

Next, as shown in FIG. 10, the RIE (i.e., Reactive Ion Etching) technique is used to form a trench TR which penetrates the separation body region 27, the barrier region 30, and the lower body region 32 from the upper surface 20a of the semiconductor substrate 20 and reaches the drift region 34. The trench TR corresponds to the trenches 91 and 92 described above.

Figure 11:
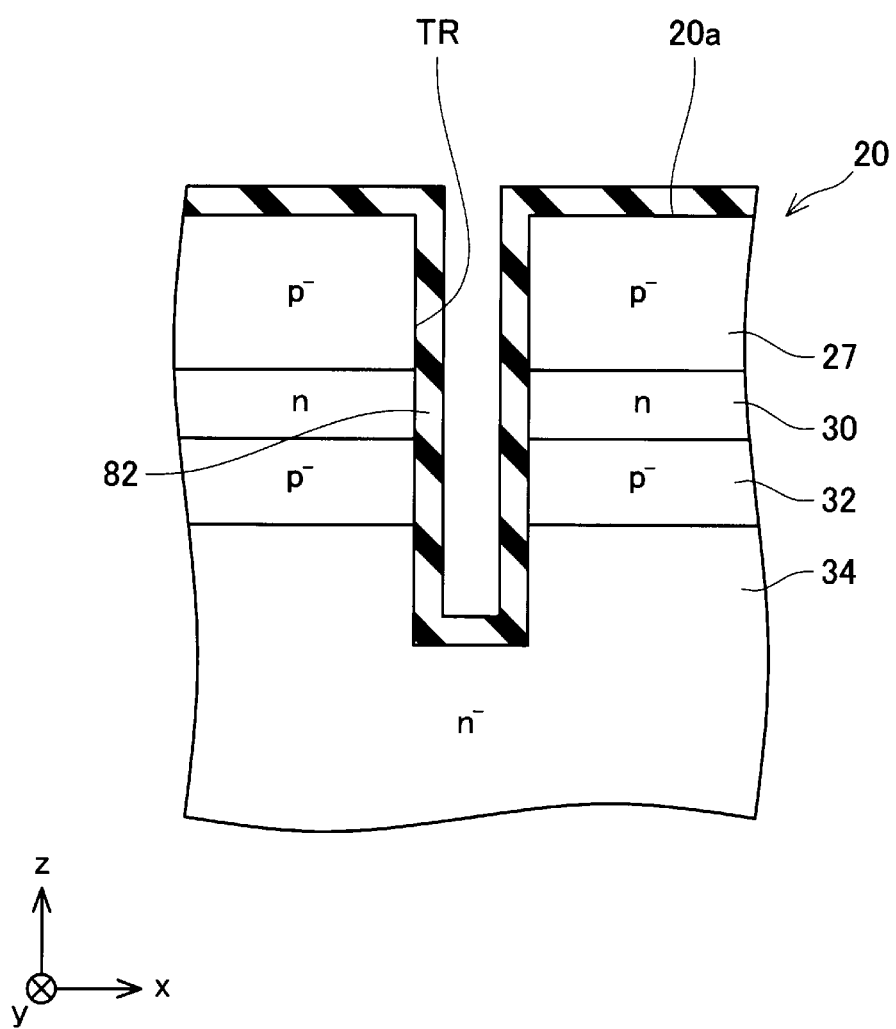
FIG. 11 is an enlarged cross-sectional view corresponding to FIG. 3, showing the step of forming the body contact region in the IGBT manufacturing method.

Next, as illustrated in FIG. 11, a gate insulation film 82 is formed on the inner surface of the trench TR and the upper surface 20a of the semiconductor substrate 20 using a thermal oxidation technique.

Figure 12:
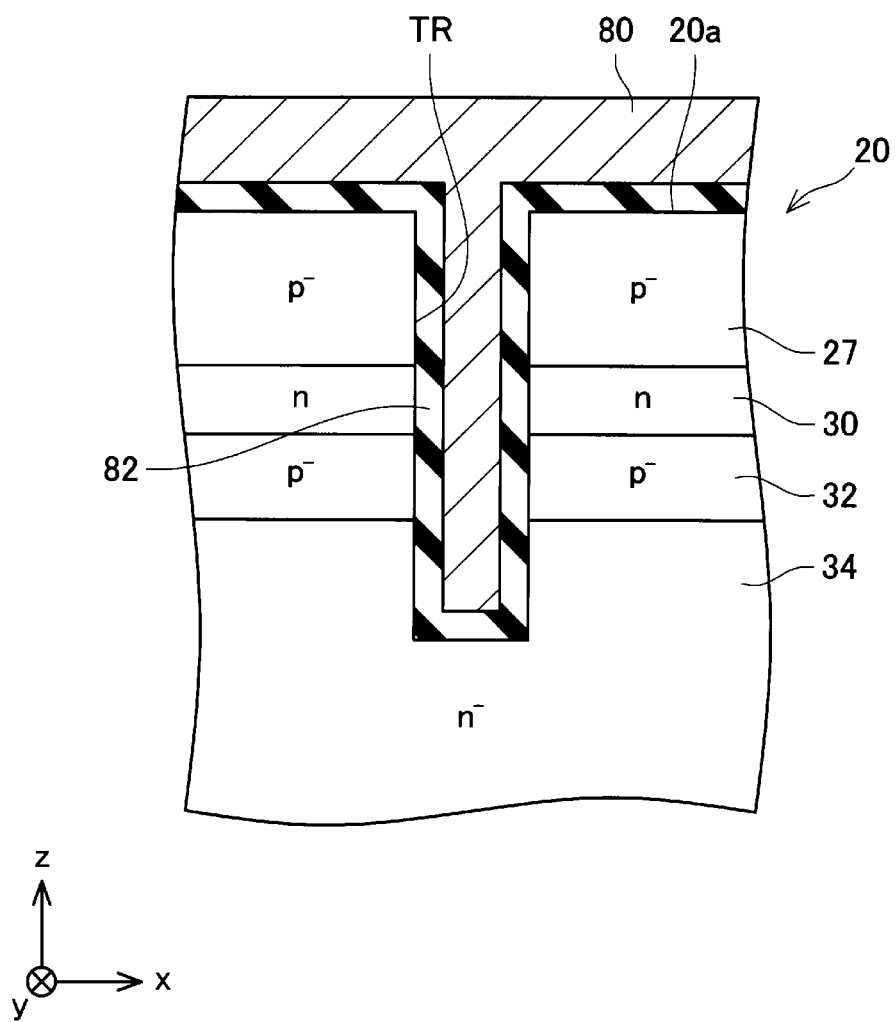
FIG. 12 is an enlarged cross-sectional view corresponding to FIG. 3, showing the step of forming the body contact region in the IGBT manufacturing method.

Next, as shown in FIG. 12, a polysilicon gate electrode 80 is filled in the trench TR by using the CVD technique. The gate electrode 80 is also formed on the upper surface 20a of the semiconductor substrate 20.

Figure 13:
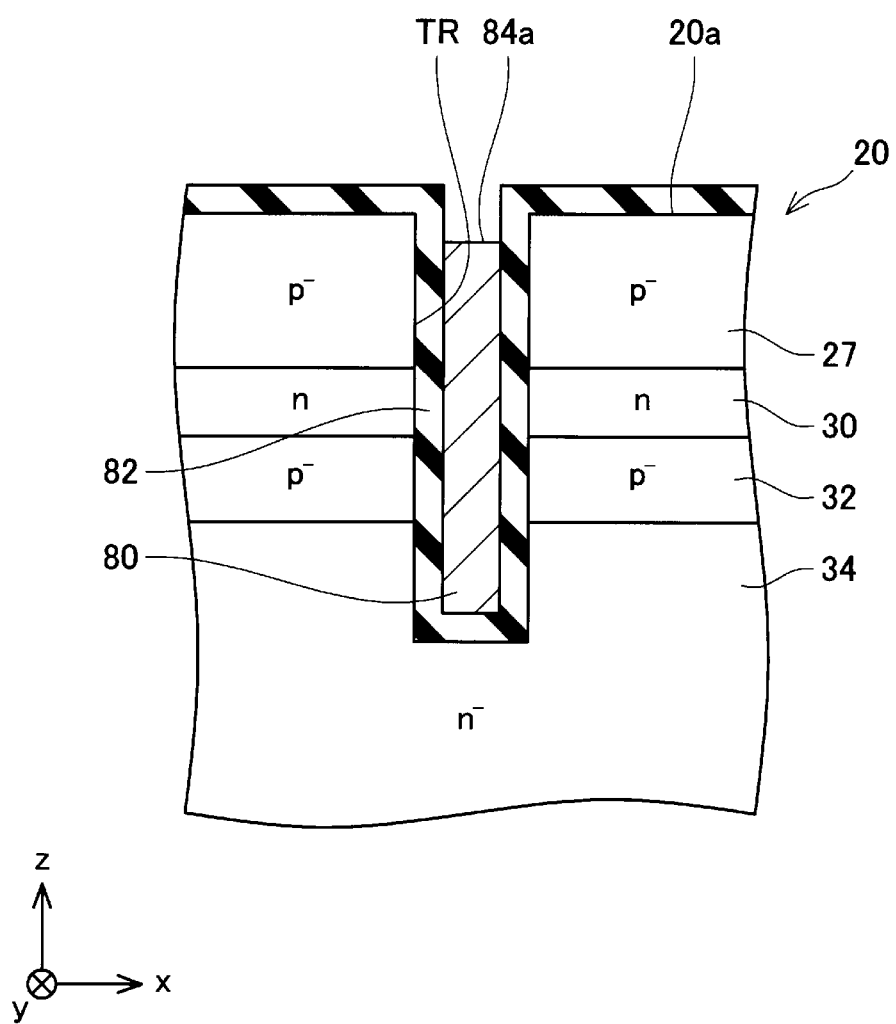
FIG. 13 is an enlarged cross-sectional view corresponding to FIG. 3, showing the step of forming the body contact region in the IGBT manufacturing method.

Next, as shown in FIG. 13, the RIE (i.e., Reactive Ion Etching) technique is used to etch back the gate electrode 80, so that the gate electrode 80 remains only in the trench TR. At this time, the upper surface 84a of the gate electrode 80 is adjusted to be deeper than the upper surface 20a of the semiconductor substrate 20.

Figure 14:
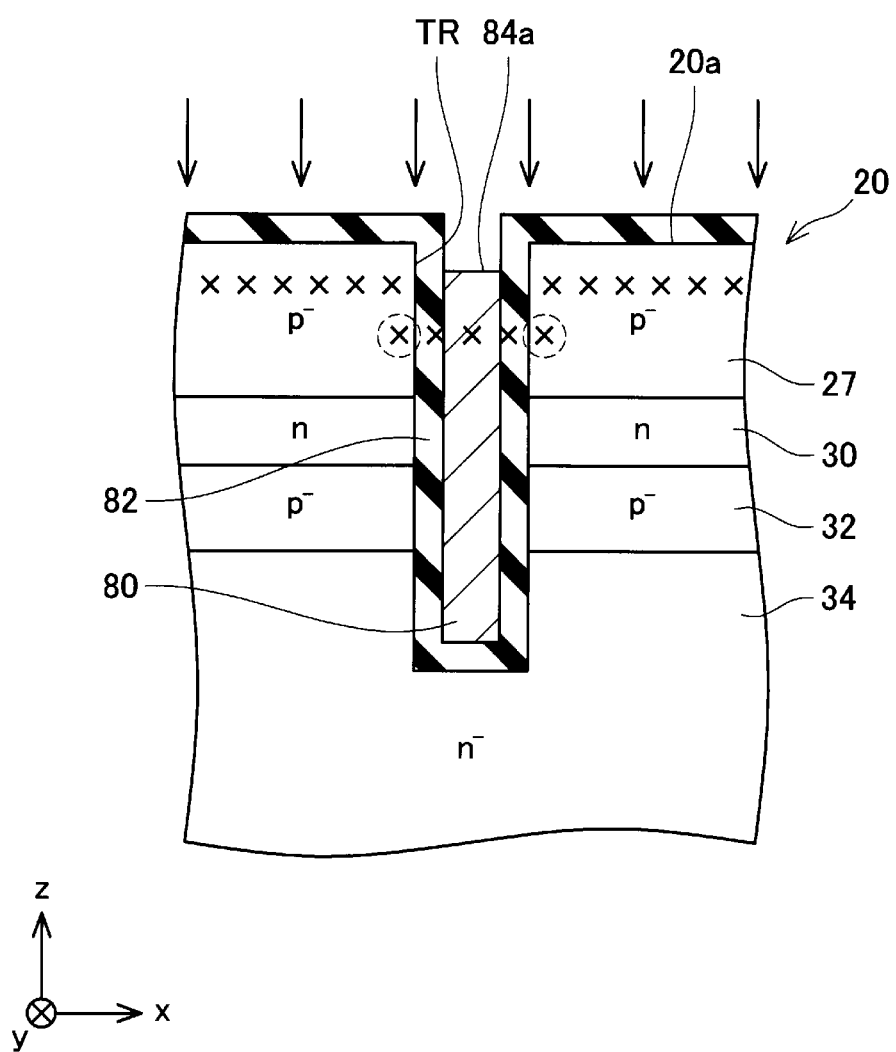
FIG. 14 is an enlarged cross-sectional view corresponding to FIG. 3, showing the step of forming the body contact region in the IGBT manufacturing method.

Next, as shown in FIG. 14, the p-type impurity is irradiated toward the position where the body contact region 24 is to be formed using an ion implantation technique. In this ion implantation process, the p-type impurity is irradiated not only in the upper surface 20a of the semiconductor substrate 20 where the body contact region 24 is to be formed, but also in the trench TR adjacent to the position where the body contact region 24 is to be formed so that the impurity is implanted across the inside and outside of the trench TR. At this time, the upper surface 84a of the gate electrode 80 filled in the trench TR is located deeper than the upper surface 20a of the semiconductor substrate 20. For this reason, the depth of the p-type impurity implanted into the gate electrode 80 from the upper surface 84a of the gate electrode 80 in the trench TR is greater than the depth of the p-type impurity implanted into the semiconductor substrate 20 from the upper surface 20a of the semiconductor substrate 20. A part of the p-type impurity implanted into the gate electrode 80 is diffused and introduced in the surface direction. For this reason, in the surface direction, the p-type impurity is also introduced into a position in contact with the side surface of trench TR (i.e., a position surrounded by a broken line in FIG. 14).

Figure 15:
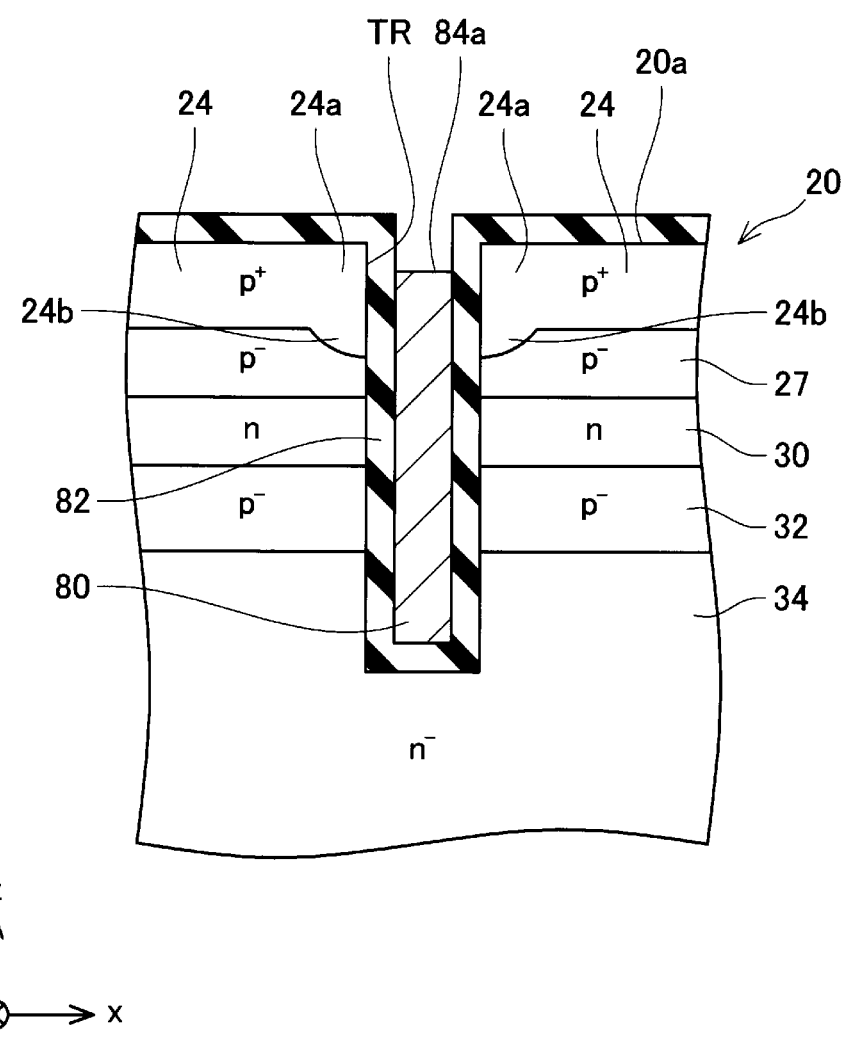
FIG. 15 is an enlarged cross-sectional view corresponding to FIG. 3, showing the step of forming the body contact region in the IGBT manufacturing method.

Next, as shown in FIG. 15, the introduced p-type impurity is diffused using an annealing technique to form a body contact region 24. Since the p-type impurity is deeply introduced at the position in contact with the side surface of the trench TR, the body contact region 24 is formed deep at the position in contact with the side surface of the trench TR. Thus, in the adjacent portion 24a adjacent to the emitter region 22 in the body contact region 24, the protrusion portion 24b formed deeper than the center side of the rectangular region can be selectively formed.

When multistage ion implantation is used instead of the above manufacturing method, not only the position adjacent to the emitter region 22 but also the entire body contact region 24 can be formed deeply. Also in this case, hole carriers can be efficiently discharged. However, in the multistage ion implantation, it is necessary to perform ion implantation a plurality of times, so that the manufacturing cost may increase. In addition, in a case where the IGBT of the above embodiment is configured as a reverse conducting IGBT in which a diode is integrated with the semiconductor substrate 20, when the entire body contact region 24 is formed deeply, a large amount of hole carriers are injected in the reflux mode, so that the switching loss may increase. In the above manufacturing method, the body contact region 24 at a position effective for discharging the hole carriers can be selectively formed deeply by performing only one ion implantation. Further, even when configured as a reverse conducting IGBT, the entire body contact region 24 is not formed deeply, so that a large amount of hole carriers are suppressed from being injected in the reflux mode, and an increase in switching loss is suppressed.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A method for manufacturing an insulated gate bipolar transistor comprising:
   forming a rectangular trench having a rectangular shape and arranged on one main surface of a semiconductor substrate;
   forming a gate insulation film on an inner surface of the rectangular trench;
   filling the rectangular trench with a gate electrode after the forming of the gate insulation film, an upper surface of the gate electrode being deeper than the one main surface of the semiconductor substrate; and
   forming a body contact region having a first conductivity type in a part of a rectangular region surrounded by the rectangular trench using an ion implantation technique, the body contact region being in contact with a side of a straight trench which constitutes one side of the rectangular trench, and the body contact region being disposed at a position adjacent to a formation area of an emitter region having a second conductivity type in contact with the side of the straight trench, wherein:
   in the forming of the body contact region, a first conductivity type impurity is implanted across both an inside and an outside of the straight trench;
   the rectangular shape of the rectangular trench is a double square shape that surrounds a portion of the semiconductor substrate when viewing a top surface of the semiconductor substrate from above in a plan view;
   the body contact region is formed such that a depth of the body contact region increases as the body contact region approaches, in a direction away from a center of the body contact region when viewed from above in the plan view, the side of the straight trench;
   the body contact region is disposed on a surface of the substrate; and
   the semiconductor substrate further includes a separation body region disposed directly beneath the body contact region and having the first conductivity type with an impurity concentration lower than an impurity concentration of the body contact region.

2. The method according to claim 1, wherein:
   a material of the gate electrode is made of polysilicon.

3. The method according to claim 1, wherein:
   the separation body region contacts the body contact region.

4. The method according to claim 1, wherein:
   the semiconductor substrate further includes a surface layer body region and a pillar region; and
   when viewed from above the semiconductor substrate, the body contact region has a checkered pattern as arranged alternatively with the surface layer body region or the pillar region.

5. An insulated gate bipolar transistor comprising:
   a semiconductor substrate;

an emitter electrode arranged on one main surface of the semiconductor substrate; and a trench gate arranged in a rectangular trench having a rectangular shape and disposed on the one main surface of the semiconductor substrate, wherein:

the semiconductor substrate includes:

a body contact region having a first conductivity type, arranged in a part of a rectangular region surrounded by the rectangular trench, and being in contact with the emitter electrode; and an emitter region having a second conductivity type, arranged in another part of the rectangular region, and being in contact with the emitter electrode;

the rectangular trench has a straight trench that constitutes one side of the rectangular trench;

the body contact region is in contact with a side of the straight trench;

the emitter region is in contact with the side of the straight trench, and is adjacent to the body contact region;

the body contact region has a protrusion portion protruding in a depth direction from a center portion of the body contact region in the rectangular region;

the protrusion portion is disposed at a position in contact with the side of the straight trench and adjacent to the emitter region;

the rectangular shape of the rectangular trench is a double square frame shape that surrounds the semiconductor substrate when viewing a top surface of the semiconductor substrate from above in a plan view;

a depth of the protrusion portion increases as the protrusion portion approaches, in a direction away from a center of the body contact region when viewed from above in the plan view, the side of the straight trench;

the body contact region is disposed on a surface of the substrate; and the semiconductor substrate further includes a separation body region disposed directly beneath the body contact region and having the first conductivity type with an impurity concentration lower than an impurity concentration of the body contact region.

6. The insulated gate bipolar transistor accord to claim 5, wherein:

the separation body region contacts the body contact region.

7. The insulated gate bipolar transistor accord to claim 5, wherein:

the semiconductor substrate further includes a surface layer body region and a pillar region; and when viewed from above the semiconductor substrate, the body contact region has a checkered pattern as arranged alternatively with the surface layer body region or the pillar region.

* * * * *